United States Patent [19]

Seko et al.

[11] Patent Number: 5,070,000

[45] Date of Patent: Dec. 3, 1991

[54] ELECTRODEPOSITION COATING COMPOSITION FOR USE IN PRINTED CIRCUIT BOARD PHOTO RESIST

[75] Inventors: Kenji Seko; Yuu Akaki; Naozumi Iwasawa; Toshio Kondo, all of Hiratsuka, Japan

[73] Assignee: Kansai Paint Co., Ltd., Amagasaki, Japan

[21] Appl. No.: 265,770

[22] Filed: Nov. 1, 1988

[30] Foreign Application Priority Data

Nov. 5, 1987 [JP] Japan ................................ 62-280224

[51] Int. Cl.$^5$ .......................... G03F 7/12; G03F 7/028
[52] U.S. Cl. .................................. 430/280; 430/308; 522/86; 522/90; 522/149; 524/555
[58] Field of Search ................. 430/280, 308; 522/86, 522/149, 90; 524/555

[56] References Cited

U.S. PATENT DOCUMENTS

| | | | |
|---|---|---|---|
| 3,100,150 | 8/1963 | Chismar et al. | 96/93 |
| 3,395,016 | 7/1968 | Loeb | 96/36 |
| 3,469,982 | 9/1969 | Celeste | 96/35.1 |
| 3,639,185 | 2/1972 | Colom et al. | 156/13 |
| 3,954,475 | 5/1976 | Bonham et al. | 96/67 |
| 4,039,414 | 8/1977 | McGinniss | 522/86 |
| 4,104,072 | 8/1978 | Golda et al. | 96/68 |
| 4,118,233 | 10/1978 | Tsunoda et al. | 96/115 P |
| 4,193,797 | 3/1980 | Cohen et al. | 430/258 |
| 4,228,232 | 10/1980 | Rousseau | 430/271 |
| 4,306,012 | 12/1981 | Scheve | 430/308 |
| 4,316,949 | 2/1982 | Petrellis et al. | 430/159 |
| 4,476,215 | 10/1984 | Kausch | 430/281 |
| 4,511,446 | 4/1985 | Abbey et al. | 524/555 |
| 4,525,260 | 6/1985 | Abbey et al. | 524/555 |
| 4,544,622 | 10/1985 | Kausch | 430/280 |
| 4,789,621 | 12/1988 | Knoth | 430/308 |

FOREIGN PATENT DOCUMENTS 976352 10/1975 Canada .
976353 10/1975 Canada .

*Primary Examiner*—Marion E. McCamish
*Assistant Examiner*—Susan Berman
*Attorney, Agent, or Firm*—Fisher, Christen & Sabol

[57] ABSTRACT

Disclosed is an electrodeposition coating composition for use in printed circuit board photo resist, comprising (a) an acrylic resin containing (meth)acryloyl group and obtained by use of diacetone (meth)acrylamide as an essential monomer component, said acrylic resin being a water-soluble or water-dispersible photo-curable unsaturated resin having an acid value of 20 to 300, a degree of unsaturation of 0.2 to 4.5 moles/kg, a number average molecular weight of 1,000 to 100,000 and a glass transition temperature of 0° to 100° C., and (b) a water-insoluble photopolymerization initiator.

7 Claims, No Drawings

ELECTRODEPOSITION COATING COMPOSITION FOR USE IN PRINTED CIRCUIT BOARD PHOTO RESIST

BACKGROUND OF THE INVENTION

(1) Field of the Invention

This invention relates to an electrodeposition coating composition for use in printed circuit board photo resist, and more particularly to an electrodeposition coating composition for use in printed circuit board photo resist, which is capable of being subjected to electrodeposition coating on a copper plated laminated plate to form a smooth, tack-free film and to form a film readily curable by use of ultraviolet light through a negative.

(2) Description of the Prior Art

A printed circuit board has conventionally been prepared typically by a process which comprises applying copper plating onto a copper foil plated, laminated plate, laminating thereonto a photosensitive film, exposing the photosensitive film to light through a photographic negative, and removing the unexposed portion, followed by etching away an unnecessary copper foil part not under a circuit pattern, and by removing the photosensitive film to form a printed circuit on the insulative laminated plate.

The photosensitive film used in the aforementioned process raises such problems that the circuit pattern formed by exposing to light and developing is not sharp because the film is so thick as to be normally in the neighborhood of 50 μm, that it is difficult to uniformly laminate the photosensitive film on the surface of the copper foil, the photosensitive film is mostly removed uselessly in spite of being expensive, and so forth.

There is also provided a process in which an etching resist is formed directly on the copper plated laminated plate by the screen printing. However, the circuit pattern formed according to the aforementioned process is not sharp because the screen meshes remain. Therefore, development of technical means to replace those by use of the above photosensitive film or in the above screen printing, has been highly demanded.

In Japanese Patent Application No. 106415/86, the present inventors propose an electrodeposition coating composition for use in printed circuit board photo resist with an attempt to use a photo-curable film formed by electrodeposition coating in place of the above photosensitive film in order to solve the aforementioned problem. The electrodeposition coating composition is capable of forming a uniform film which is developable on the surface of the copper plated laminated plate and which has excellent ultraviolet-curing properties. However, in practical use, such problems are raised that it takes a long period of time to remove a non-exposed part of the film with a weak alkali after being exposed to light through the negative film, and that it is difficult and takes a long period of time to remove the cured film with a strong alkali after etching away the copper foil to form the circuit.

SUMMARY OF THE INVENTION

It is an object of the present invention to provide an electrodeposition coating composition for use in printed circuit board photo resist, which is capable of being readily subjected to the anionic electrodeposition coating so that the deposited film may be heated and dried to form a uniform photosensitive film.

It is another object of the present invention to provide an electrodeposition coating composition for use in printed circuit board photo resist, use of which makes it possible to form a sharp circuit pattern.

It is still another object of the present invention to provide an electrodeposition coating composition for use in printed circuit board photo resist, use of which makes it possible to form such a photosensitive film that when the photosensitive film is exposed to light through a negative film, the non-exposed part of the film is developed in a short period of time by use of a weak alkali, and the exposed part of the film, too, is easily dissolved and removed in a short period of time by use of a strong alkali.

That is, the present invention provides an electrodeposition coating composition for use in printed circuit board photo resist, comprising (a) an acrylic use of diacetone (meth)acrylamide as an essential monomer component, said acrylic resin being a water-soluble or water-dispersible photo-curable unsaturated resin having an acid value of 20 to 300, a degree of unsaturation of 0.2 to 4.5 moles/kg, a number average molecular weight of 1,000 to 100,000 and a glass transition temperature of 0° to 100° C., and (b) a water-insoluble photopolymerization initiator.

DETAILED DESCRIPTION OF THE INVENTION

The water-soluble or water-dispersible photo-curable unsaturated resin (hereinafter referred to as a photo-curable resin) is prepared according to the following process (i) or (ii).

The process (i) comprises copolymerizing diacetone (meth)acrylamide represented by the general formula:

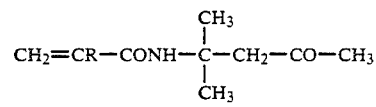

where R represents H or CH$_3$, and α,β-ethylenically unsaturated acid as the essential components with (meth)acrylic esters to obtain an acrylic resin, followed by addition of a glycidyl group-containing unsaturated compound to the acrylic resin.

The process (ii) comprises copolymerizing diacetone (meth)acrylamide, α,β-ethylenically unsaturated acid and hydroxyl group-containing unsaturated monomer as the essential components with (meth)acrylic esters to obtain an acrylic resin, followed by addition of an isocyanate group-containing unsaturated compound to the acrylic resin or by addition of both glycidyl group-containing unsaturated compound and isocyanate group-containing unsaturated compound.

Examples of the α,β-ethylenically unsaturated acid used in the preparation of the acrylic resin according to the aforementioned processes (i) and (ii) include acrylic acid, methacrylic acid, maleic acid, itaconic acid, and the like. Examples of the hydroxyl group-containing unsaturated monomer include hydroxyethyl (meth)acrylate, hydroxypropyl (meth)acrylate, hydroxybutyl methacrylate, and the like. Examples of (meth)acrylic esters include methyl (meth)acrylate, ethyl (meth)acrylate, propyl (meth)acrylate, butyl (meth)acrylate, 2-ethylhexyl (meth)acrylate, and the like. In the preparation of the acrylic resin, an unsaturated monomer such as styrene, (meth)acrylonitrile, acrylamide and the like, may, at need, be copolymerized therewith.

An amount of diacetone (meth)acrylamide in the acrylic resin is in the range of from 1 to 95% by weight, preferably 10 to 60% by weight. When it is outside the above range, the present invention's object to shorten the developing time of the photosensitive film and the peeling time of the cured film, is not achieved.

Specific examples of the glycidyl group-containing unsaturated compound subjected to addition to the aforementioned acrylic resin include glycidyl (meth)acrylate, aryl glycidyl ether, and the like. The isocyanate group-containing unsaturated compound includes those obtained by addition reaction of the aforementioned hydroxyl group-containing unsaturated monomer to polyisocyanate having 2 or more isocyanate groups in one molecule.

The polyisocyanate having 2 or more, preferably 2 to 3 isocyanate groups in one molecule may be any of aliphatic-based, alicyclic-based, aromatic-based and aromatic-aliphatic-based ones, and, for example, includes tolylene diisocyanate, 4,4'-diphenylmethane diisocyanate, xylylene diisocyanate, xylene diisocyanate, hexamethylene diisocyanate, lysine diisocyanate, 4,4'-methylene bis(cyclohexyl isocyanate), methyl cyclohexane 2,4-(or 2,6)diisocyanate, isophorone diisocyanate, trimethyl hexamethylene diisocyanate, dimer acid diisocyanate, phenyl diisocyanate, methylene diisocyanate, ethylene diisocyanate, butylene diisocyanate, propylene diisocyanate, octadecylene diisocyanate, 1,5-naphthalene diisocyanate, triphenylmethane triisocyanate, naphthylene diisocyanate, polymers of tolylene diisocyanate, polymers of hexamethylene diisocyanate, 1,4-tetramethylene diisocyanate, 1,6-hexamethylene diisocyanate, 1,10-decamethylene diisocyanate, 1,3-cyclohexylene diisocyanate, 4,4'-methylene-bis(cyclohexyl isocyanate), and the like, these being used alone or in combination of 2 or more thereof. Of these, the most preferable examples thereof include isophorone diisocyanate, xylylene diisocyanate, tolylene diisocyanate, 1,6-hexane diisocyanate, and the like.

It is necessary for the photo-curable resin prepared according to the aforementioned process to have an acid value of 20 to 300, preferably 30 to 100, a degree of unsaturation of 0.2 to 4.5 moles/kg, preferably 0.7 to 4.0 moles/kg, a number average molecular weight of 1,000 to 100,000, preferably 3,000 to 50,000, and a glass transition temperature (Tg) of 0° to 100° C., preferably 20° to 70° C.

When the acid value of the photo-curable resin is less than 20, it is impossible to make it water-soluble or water-dispersible, resulting in not forming the electrodeposition coating composition, and when the acid value is more than 300, coating of the electrodeposition coating composition on the plate becomes difficult, and in order to increase the coating weight, an increased electric power is needed.

When the number average molecular weight of the photo-curable resin is less than 1,000, at the time when the electrodeposition coating is carried out, the coated film is liable to be broken, resulting in not obtaining a uniform film. On the other hand, when it is more than 100,000, the electrodeposition coating film becomes poor in smoothness and has an uneven surface, resulting in poor printed image resolution.

When the glass transition temperature Tg is lower than 0° C., the electrodeposition coating film shows such a stickiness that refuses and dusts are liable to stick onto the film and that it is difficult for the film to be handled. To the contrary, when the glass transition temperature Tg is higher than 100° C., the electrodeposition coating film formed becomes so hard as to cause crazing.

When the degree of unsaturation of the photo-curable resin is less than 0.2 mole/kg, photosensitivity becomes poor and irradiation must be carried out for a long period of time so that the film may be cured. On the other hand, when it is more than 4.5 moles/kg, thermal stability of the photo-curable resin becomes poor, resulting in such drawbacks that gelation of the resin takes place during synthesis or storage thereof.

The electrodeposition coating composition of the present invention may include, in addition to the aforementioned photo-curable resin, a photo-curable resin capable of being subjected to anionic electrodeposition, such as a resin prepared by reacting a hydroxyl group-containing high acid value acrylic resin free of the diacetone (meth)acrylamide component with an equimolar adduct of diisocyanate with hydroxyethyl (meth)acrylate, a resin prepared by addition of a glycidyl group-containing unsaturated compound to a high acid value acrylic resin free of the diacetone (meth)acrylamide component, and the like; a polymerizable unsaturated group-containing resin such as an ethylenically unsaturated group-containing polyester acrylate resin, polyurethane resin, epoxy resin, acrylic resin and the like; a vinyl monomer such as (meth)acrylic esters or the like; an oligomer such as diethylene glycol di(meth)acrylate or the like; and the like in an amount of 100 parts by weight or less, preferably 50 parts by weight or less per 100 parts by weight of the photo-curable resin to arbitrarily control film performance.

The photo-curable resin in the present invention is made water-dispersible or water-soluble by neutralizing carboxyl group contained in the resin skeleton with an alkali as the neutralizing agent. Examples of the neutralizing agent include alkanol amines such as monoethanolamine, diethanolamine, triethanolamine and the like, alkyl amines such as triethylamine, diethylamine, monoethylamine, diisopropylamine, trimethylamine, diisobutylamine and the like, alkylalkanol amines such as dimethylaminoethanol and the like, alicyclic amines such as cyclohexylamine and the like, alkali metal hydroxides such as caustic soda, caustic potash and the like, ammonia, and the like, these being used alone or as mixtures thereof. The amount of the neutralizing agent is preferably in the range of from 0.4 to 1.0 equivalent per one mole of carboxyl group contained in the resin skeleton. When it is less than 0.4 equivalent, water dispersibility becomes poor and electrodeposition coating is made difficult. When it is more than 1.0 equivalent, storage stability undesirably becomes poor.

A hydrophilic solvent may be added in order to further improve flowability of the resin component made water-soluble or water-dispersible. Examples of the hydrophilic solvent include isopropanol, n-butanol, t-butanol, methoxyethanol, ethoxyethanol, butoxyethanol, diethylene glycol, methylether, dioxane, tetrahydrofuran and the like. The amount of the hydrophilic solvent is desirably in the range of 300 parts by weight or less per 100 parts by weight of the resin component.

A hydrophobic solvent may be added in order to increase the coating weight onto the base plate. Examples of the hydrophobic solvent include petroleum solvent such as toluene, xylene and the like, ketones such as methyl ethyl ketone, methyl isobutyl ketone and the like, esters such as ethyl acetate, butyl acetate and the like, alcohols such as 2-ethylhexyl alcohol, and the like. The amount of the hydrophobic solvent is desirably in the range of 200 parts by weight or less per 100 parts by weight of the resin component.

Examples of the water-insoluble photopolymerization initiator used in the present invention include benzoin, benzoin methyl ether, benzoin ethyl ether, benzyl, diphenyl disulfide, tetramethylthiuram monosulfide, eosin, Thionine, diacetyl, Michler's ketone, anthraquinone, chloroanthraquinone, methylanthraquinone, α-hydroxyisobutylphenone, P-isopropyl-α-hydroxyisobutylphenone, α,α'-dichloro-4-phenoxyacetophenone, 1-hydroxy-1-cyclohexylacetophenone, 2,2-dimethoxy-2-phenylacetophenone, methylbenzoyl formate, 2-methyl-1-[4-(methylthio)phenyl]-2-morpholinopropene, thioxanthone, benzophenone, and the like, the amount thereof to be used being desirably in the range of from 0.1 to 10 parts by weight per 100 parts by weight of the resin component as solids. When it is less than 0.1 part by weight, curing properties undesirably becomes poor, and when it is more than 10 parts by weight, deterioration of the cured film in mechanical strength takes place. The water-soluble photopolymerization initiator is undesirable to be used, because the use thereof results in making it difficult to be subjected to electrodeposition in a state uniformly mixed with the photo-curable resin. Dyes and pigments may, at need, be added, too.

The electrodeposition coating applied onto the printed circuit board by use of the electrodeposition coating composition of the present invention is carried out as follows.

That is, it is carried out according to a process which comprises controlling an electrodeposition coating bath containing, as the major component, a neutralized photo-curable resin obtained by neutralizing the photo-curable resin under the conditions of a pH of 6.5 to 9, a bath concentration as a solids concentration of 3 to 25% by weight, preferably 5 to 15% by weight, and a bath temperature of 15° to 40° C., preferably 15° to 30° C., dipping a copper foil plated insulative plate as an anode into the electrodeposition coating bath controlled as above, and applying a direct current under 40 to 400 V, wherein an application time of the direct current is desirably in the range of 30 seconds to 5 minutes, and a resulting film thickness as the dry film is desirably in the range of 5 to 100 μm, preferably 10 to 60 μm.

After the completion of the electrodeposition coating, the plate thus coated is taken out of the electrodeposition bath to be washed with water, and the moisture contained in the electrodeposition coating film is removed with hot air or the like.

Next, a pattern mask is applied onto an uncured, photo-curable electrodeposition coating film formed on the plate to be exposed to an active light, a non-exposed area other than an area to form a conductive circuit is removed by developing treatment.

The active light used in the step of exposing to light in the present invention varies depending on an absorption of the photopolymerization initiator, but is preferably a light having a wave length of 3000 to 4500 Å. Examples of the light source include the sunlight, mercury vapor lamp, xenon lamp, arc lamp and the like. Curing of the film by irradiation of the active light is effected within several minutes, normally in the range of one second to 20 minutes.

The developing treatment is carried out by spraying a weak alkali water on the film to wash away the uncured area of the film. The alkali includes those capable of neutralizing with a free carboxylic acid present in the film to make water-soluble, and examples thereof include caustic soda, sodium carbonate, caustic potash, ammonia and the like.

The copper foil part exposed on the plate due to the developing treatment, i.e. the copper foil part not forming the circuit, is removed by the conventional etching treatment using ferric chloride and the like. Thereafter, the photo-curable film on the circuit pattern is also dissolved and removed by use of a strong alkali such as caustic soda or the like to form a printed circuit on the plate.

The present invention makes it possible to provide an electrodeposition coating composition for use in printed circuit board photo resist, which is capable of being readily subjected to the anionic electrodeposition coating so that the deposited film may be heated and dried to form a uniform photosensitive film.

The present invention makes it possible to provide an electrodeposition coating composition for use in printed circuit board photo resist, use of which makes it possible to form a sharp circuit pattern.

The present invention makes it possible to provide an electrodeposition coating composition for use in printed circuit board photo resist, use of which makes it possible to form such a photosensitive film that when the photosensitive film is exposed to light through a negative film, the non-exposed part of the film is developed in a short period of time by use of a weak alkali, and the exposed part of the film, too, is easily dissolved and removed in a short period of time by use of a strong alkali.

The present invention will be explained more in detail by the following Examples.

PHOTO-CURABLE RESIN PREPARATION EXAMPLE 1

A liquid mixture of 20 parts by weight of diacetone acrylamide, 40 parts by weight of methyl methacrylate, 20 parts by weight of butyl acrylate, 20 parts by weight of acrylic acid and 2 parts by weight of azobisisobutyronitrile is dropped over 3 hours into 90 parts by weight of propylene glycol monomethyl ether as a hydrophilic solvent held at 110° C. under nitrogen gas atmosphere, followed by one hour's aging. A liquid mixture of one part by weight of azobisdimethylvaleronitrile and 10 parts by weight of propylene glycol monomethyl ether is then dropped over one hour, followed by 5 hours' aging to obtain a solution of a high acid value acrylic resin having an acid value of 155. Next, to the solution is added 24 parts by weight of glycidyl methacrylate, 0.12 part by weight of hydroquinone and 0.6 part by weight of tetraethylammonium bromide to be reacted blowing air thereinto at 110° C. for 5 hours and to obtain a photo-curable resin solution. The photo-curable resin has an acid value of about 50, a degree of unsaturation of 1.35 moles/kg, a glass transition temperature Tg of 25° C. and a number average molecular weight of 20,000.

PHOTO-CURABLE RESIN PREPARATION EXAMPLE 2

A liquid mixture of 40 parts by weight of diacetone acrylamide, 20 parts by weight of styrene, 10 parts by weight of methylacrylate, 30 parts by weight of acrylic acid and 3 parts by weight of azobisisobutyronitrile is dropped over 3 hours into 90 parts by weight of Cellosolve held at 120° C. under nitrogen gas atmosphere, followed by one hour's aging. A liquid mixture of one part by weight of azobisdimethylvaleronitrile and 10 parts by weight of Cellosolve is then dropped over one hour, followed by 5 hours' aging to obtain a solution of a high acid value acrylic resin having an acid value of 233. Next, to the solution is added 35 parts by weight of glycidyl methacrylate, 0.13 part by weight of hydroquinone and 0.6 part by weight of tetraethylammonium bromide to be reacted blowing air thereinto at 110° C. for hours and to obtain a photo-curable resin solution. The photo-curable resin has an acid value of about 70, a degree of unsaturation of 1.83 moles/kg, a glass transition temperature Tg of 40° C. and a number average molecular weight of about 15,000.

PHOTO-CURABLE RESIN PREPARATION EXAMPLE 3

A liquid mixture of 20 parts by weight of diacetone acrylamide, 20 parts by weight of methyl methacrylate, 25 parts by weight of butylacrylate, 15 parts by weight of 2-hydroxyethyl methacrylate, 20 parts by weight of acrylic acid and 2 parts by weight of azobisisobutyronitrile is dropped over 2 hours into 100 parts by weight of dioxane as a hydrophilic solvent held at 105° C. under nitrogen gas atmosphere, followed by one hour's aging at that temperature to obtain a solution of a high acid value acrylic resin having an acid value of 155. Next, to 200 parts by weight of the solution is added 20 parts by weight of an equimolar adduct of 2-hydroxyethyl methacrylate with tolylene diisocyanate to be reacted blowing air thereinto at 80° C. for 5 hours and to obtain a photo-curable resin solution. The photo-curable resin has an acid value of about 120, a degree of unsaturation of 0.56 moles/kg and a number average molecular weight of about 20,000.

PHOTO-CURABLE RESIN PREPARATION EXAMPLE 4

A liquid mixture of 25 parts by weight of diacetone acrylamide, 10 parts by weight of methyl methacrylate, 25 parts by weight of butylacrylate, 15 parts by weight of 2-hydroxyethyl methacrylate, 25 parts by weight of acrylic acid and 3 parts by weight of azobisisobutyronitrile is dropped over 2 hours into 100 parts by weight of dioxane as a hydrophilic solvent held at 105° C. under nitrogen gas atmosphere, followed by one hour's aging at that temperature to obtain a solution of a high acid value acrylic resin having an acid value of 229. Next, to 200 parts by weight of the solution is added 22 parts by weight of an equimolar adduct of 2-hydroxyacrylate with isophorone diisocyanate to be reacted blowing air thereinto at 100° C. for 5 hours, followed by adding 20 parts by weight of glycidyl methacrylate and 0.5 part by weight of tetraethylammonium bromide and reacting at 110° C. for 5 hours to obtain a photo-curable resin solution. The photo-curable resin has an acid value of about 80, a degree of unsaturation of 1.4 moles/kg, and a number average molecular weight of 15,000.

PHOTO-CURABLE RESIN PREPARATION EXAMPLE 5

A photo-curable resin solution is prepared in the same manner as in Preparation Example 1 except that methyl methacrylate is used in place of diacetone acrylamide used in Preparation Example 1. The photo-curable resin has an acid value, a degree of unsaturation, a glass transition temperature Tg and a number average molecular weight, all of which are identical to those in Preparation Example 1.

PHOTO-CURABLE RESIN PREPARATION EXAMPLE 6

A photo-curable resin solution is prepared in the same manner as in Preparation Example 3 except that ethyl methacrylate is used in place of diacetone acrylamide used in Preparation Example 3. The photo-curable resin has an acid value, a degree of unsaturation, a number average molecular weight and Tg, all of which are identical to those in Preparation Example 3.

EXAMPLE 1

To 227 parts by weight of the photo-curable resin solution in Preparation Example 1 is added 6.7 parts by weight of triethylamine to be sufficiently neutralized, followed by adding 6 parts by weight of α-hydroxyisobutylphenone as a photopolymerization initiator and adding a deionized water in such an amount that a solids content may be 10% by weight to prepare an electrodeposition coating bath having a pH of 7.0. A copper plated laminated plate (100×200×1.6 mm) for use in a printed circuit and having 0.4 mm through-holes is dipped as an anode in the electrodeposition coating bath, and a direct current under 120 V is applied at a bath temperature of 25° C. to carry out electrodeposition coating. The film thus formed is washed with water and dried at 70° C. for 10 minutes to obtain a tack-free, smooth photosensitive film having a thickness of 25 μ. A negative film is adhered to the coated film through a vacuum device and irradiation is effected on both sides thereof in an irradiation dose of 400 mj/cm² respectively by use of a superhigh pressure mercury vapor lamp.

EXAMPLE 2

To 240 parts by weight of the photo-curable resin solution in Preparation Example 2 is added 8.5 parts by weight of triethylamine to be sufficiently neutralized, followed by adding 40 parts by weight of isobutyl alcohol and 7 parts by weight of benzoin ethyl ether as a photopolymerization initiator and adding a deionized water in such an amount that a solids content may be 10% by weight to prepare an electrodeposition coating bath having a pH of 7.3. Thereafter experiments of Example 1 are repeated by use of the electrodeposition coating bath in place of that in Example 1.

EXAMPLE 3

To 240 parts by weight of the photo-curable resin solution in Preparation Example 2 are added 4 parts by weight of pentaerythritol triacrylate, 40 parts by weight of isobutyl alcohol and 8.5 parts by weight of triethylamine to be sufficiently neutralized, followed by adding 40 parts by weight of isobutyl alcohol and 7 parts by weight of benzoin ethyl ether as a photopolymerization initiator and adding a deionized water in such an amount that the solids content may be 10% by weight to prepare an electrodeposition coating bath having a pH of 7.3. Thereafter experiments of Example 1 are repeated by use of the electrodeposition coating bath in place of that in Example 1.

EXAMPLE 4

To 220 parts by weight of the photo-curable resin solution in Preparation Example 3 is added 13 parts by weight of triethylamine to be sufficiently neutralized, followed by adding 40 parts by weight of isobutyl alcohol and 6 parts by weight of benzoin ethyl ether, and adding a deionized water in such an amount that the solids content may be 10% by weight to prepare an electrodeposition coating bath having a pH of 7.7. Thereafter experiments of Example 1 are repeated by use of the electrodeposition coating bath in place of that in Example 1.

EXAMPLE 5

To 246 parts by weight of the photo-curable resin solution in Preparation Example 4 is added 12 parts by weight of triethylamine to be sufficiently neutralized, followed by adding 40 parts by weight of isobutyl alcohol and 7 parts by weight of benzoin ethyl ether as a photopolymerization initiator, and adding a deionized water in such an amount that the solids content may be 10% by weight to prepare an electrodeposition coating bath having a pH of 7.0. Thereafter the experiments of Example 1 are repeated by use of the electrodeposition coating bath in place of that in Example 1.

COMPARATIVE EXAMPLE 1

To 227 parts by weight of the photo-curable resin solution in Preparation Example 5 is added 6.7 parts by weight of triethylamine to be sufficiently neutralized, followed by adding 6 parts by weight of α-hydroxyisobutylphenone as a photopolymerization initiator, and adding a deionized water in such an amount that the solids content may be 10% by weight to prepare an electrodeposition coating bath. Thereafter the experiments of Example 1 are repeated by use of the electrodeposition

COMPARATIVE EXAMPLE 2

To 220 parts by weight of the photo-curable resin solution in Preparation Example 6 is added 13 parts by weight of triethylamine to be sufficiently neutralized, followed by adding 40 parts by weight of isobutyl alcohol and 6 parts by weight of benzoin ethyl ether, and adding a deionized water in such an amount that the solids content may be 10% by weight to prepare an electrodeposition coating bath. Thereafter the experiments of Example 1 are repeated by use of the electrodeposition coating bath in place of that in Example 1.

EXAMPLES 1-5 AND COMPARATIVE EXAMPLES 1-2 (CON.)

After being subjected to irradiation, respective non-exposed areas of the coated films in Examples 1-5 and Comparative Examples 1-2 are subjected to washing out development with 1% sodium carbonate solution as a weak alkali solution and washed with water, followed by etching away copper foil with ferric chloride, and the cured films in the exposed areas are removed with 5% caustic soda solution respectively to obtain printed circuit plates with clean and sharp patterns respectively. However, the results of measurements of developing time and cured film peeling time show that those in Examples are considerably shorter than those in Comparative Examples as shown in Table 1.

TABLE 1

|  | Developing time (sec) | Cured film Peeling time (sec) |
|---|---|---|
| Example 1 | 30 | 60 |
| Example 2 | 30 | 60 |
| Example 3 | 45 | 80 |
| Example 4 | 60 | 100 |
| Example 5 | 60 | 100 |
| Comparative Example 1 | 120 | 600 |
| Comparative Example 2 | 240 | 1800 |

Development is carried out by dipping the coated plate into a 1% sodium carbonate solution, and peeling of the cured film is carried out by dipping the plate subjected to etching treatment into a 5% caustic soda solution at 50° C.

What is claimed is:

1. An electrodeposition coating composition for use in printed circuit board photo resist, comprising (a) a water-soluble or water-dispersible photo-curable unsaturated resin prepared by a process which comprises copolymerizing diacetone (meth)acrylamide represented by the general formula:

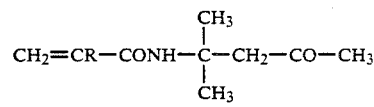

where R represents H or CH$_3$, and α,β-ethylenically unsaturated acid as the essential components with (meth)acrylic esters to obtain an acrylic resin, followed by addition of a glycidyl group-containing unsaturated compound to the acrylic resin, and having an acid value of 20 to 300, a degree of unsaturation of 0.2 to 4.5 moles/kg, a number average molecular weight of 1,000 to 100,000 and a glass transition temperature of 0° C. to 100° C., and (b) a water-insoluble photopolymerization initiator.

2. An electrodeposition coating composition as claimed in claim 1 wherein an amount of diacetone (meth)acrylamide in the acrylic resin is in the range of from 1 to 95 percent by weight.

3. An electrodeposition coating composition as claimed in claim 1 wherein said water-insoluble photopolymerization initiator is used in an amount of 0.1 to 10 parts by weight per 100 parts by weight of the resin component as solids.

4. An electrodeposition coating composition for use in a printed circuit board photo resist, comprising (a) a water-soluble or water-dispersible photo-curable unsaturated resin prepared by a process which comprises copolymerizing diacetone (meth)acrylamide represented by the general formula:

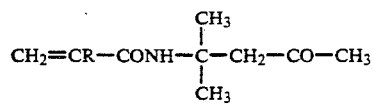

where R represents H or CH$_3$, and α,β-ethylenically unsaturated acid as the essential components with (meth)acrylic esters to obtain a high acid value acrylic resin, followed by addition of a glycidyl group-containing unsaturated compound to the high acid value acrylic resin, and having an acid value of 30 to 100, a degree of unsaturation of 0.7 to 4.0 moles/kg, a number average molecular weight of 3,000 to 50,000 and a glass transition temperature of 20° C. to 70° C., and (b) a water-insoluble photopolymerization initiator.

5. An electrodeposition coating composition as claimed in claim 4, wherein said water-soluble or water-dispersible photo-curable unsaturated resin is prepared by a process which comprises copolymerizing diacetone (meth)acrylamide, α,β-ethylenically unsaturated acid and hydroxyl group-containing unsaturated monomer as the essential components with (meth)acrylic esters to obtain an acrylic resin, followed by addition of an isocyanate group-containing unsaturated compound to the acrylic resin or by addition of both glycidyl group-containing unsaturated compound and isocyanate group-containing unsaturated compound.

6. The electrodeposition coating composition as claimed in claim 4 wherein an amount of diacetone (meth)acrylamide in the acrylic resin (a) is in the range of from 1 to 95 percent by weight.

7. The electrodeposition coating composition as claimed in claim 4 wherein said water-insoluble photopolymerization initiator is used in an amount of 0.1 to 10 parts by weight per 100 parts by weight of the resin component as solids.

* * * * *